United States Patent
Goode, III et al.

(10) Patent No.: US 6,222,469 B1
(45) Date of Patent: *Apr. 24, 2001

(54) SYNCHRO-TO-DIGITAL CONVERSION WITH WINDOWED PEAK DETERMINATION

(75) Inventors: Joseph W. Goode, III, Alpharetta; John R. Smith, Buford; Kenneth D. Ashcraft, Alpharetta, all of GA (US)

(73) Assignees: Universal Avionics Systems Corporation, Norcross, GA (US); Instrument Division and L-3 Communications, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/577,024

(22) Filed: May 23, 2000

Related U.S. Application Data

(63) Continuation of application No. 09/227,456, filed on Jan. 8, 1999, now Pat. No. 6,075,472.
(60) Provisional application No. 60/072,377, filed on Jan. 9, 1998.

(51) Int. Cl.[7] .................................................. H03M 1/48
(52) U.S. Cl. ......................... 341/111; 341/116; 318/652; 702/145
(58) Field of Search ........... 341/111–116; 318/652–661; 702/142, 150, 151

(56) References Cited

U.S. PATENT DOCUMENTS

| | | | |
|---|---|---|---|
| 3,618,073 | 11/1971 | Domchick et al. | 340/347 SY |
| 4,651,130 * | 3/1987 | Pennell | 341/116 |
| 4,876,655 | 10/1989 | Carlton et al. | 364/487 |
| 5,034,743 * | 7/1991 | Deppe et al. | 341/116 |
| 5,646,496 * | 7/1997 | Woodland et al. | 341/116 |
| 5,757,560 | 5/1998 | Fisherman | 359/821 |

OTHER PUBLICATIONS

Synchro/Resolver Conversion Handbook Fourth Edition, DDC ILC Data Device Corporation, 1974, pp. 1–342.

* cited by examiner

Primary Examiner—Howard L. Williams
(74) Attorney, Agent, or Firm—Standley & Gilcrest LLP

(57) ABSTRACT

The present invention is directed to a method and apparatus which utilizes a software-based digital signal processing circuit to generate a signal which is representative of the status of a movable component. A preferred embodiment of the apparatus of the present invention includes a synchro which is connected to a movable component. An analog reference excitation may be applied to the synchro, and the synchro generates analog synchro signals which bear a relationship to the status of the movable component. The analog synchro signals are converted to digital synchro signals by a plurality of analog-to-digital converters. A digital reference signal and the digital synchro signals are provided to a software-based digital signal processing circuit which preferably corrects constant and time-varying errors in the digital synchro signals and generates a status signal which is representative of the status of the movable component. For instance, the status signal may represent the angular position of the movable component. A different embodiment of the status signal may represent the angular velocity of the movable component.

42 Claims, 20 Drawing Sheets

SYNCHRO-TO-DIGITAL CONVERSION WITH WINDOWED PEAK DETERMINATION

This application is a continuation of application Ser. No. 09/227,456 filed Jan. 8, 1999, now U.S. Pat. No. 6,075,472, which claims the benefit of U.S. Provisional Application No. 60/072,377, filed Jan. 9, 1998, both of which are incorporated herein by reference.

BACKGROUND AND SUMMARY OF THE INVENTION

The present invention relates generally to a method and apparatus for converting analog synchro signals to a signal which is representative of the status of a movable component, and more particularly, to a method and apparatus which uses a software-based digital signal processing circuit to generate a signal which is representative of the status of a movable component. The present invention is particularly effective in a servomechanism. A servomechanism is a system in which an input command controls a physical output. A servomechanism may be comprised of a mechanical output component which is moved in response to an electrical input command. The mechanical output component may be a shaft which is rotated about an axis in accordance with the electrical input command. For example, a common electrical motor has a rotor which is driven by an electrical input command to rotate about a stationary stator. In such servomechanisms, the electrical input command can function to rotate the shaft at a desired rotational velocity, to drive the rotor to a desired rotational position, or to apply a desired torque or tension to a load.

A servomechanism commonly includes a closed feedback loop. A closed feedback loop may compare the present electrical input command to a signal which is representative of the present status of the mechanical output component. If a variance exists between the two signals, an error signal is generated which tends to eliminate the discrepancy between the present status of the mechanical output component and the present electrical input command.

In applications which utilize servomechanisms, it is often necessary to know the precise status of the mechanical output component at any given point in time. The closed feedback loop described above tends to eliminate the variance between the present status of the mechanical output component and the present electrical input command. As a result, such a closed feedback loop provides a means to know the precise status of the mechanical output component.

Knowledge of the precise status of the mechanical output component can be used to improve the performance of the servomechanism. For example, the performance of a common electrical motor can be improved if the rotational velocity or position of the rotor is known. As mentioned above, a status signal may represent the present status of the mechanical output component. More precisely, a status signal may be an analog or digital electrical signal which is indicative of the mechanical output component relative to a predetermined starting or reference position. For example, a status signal may represent a position between 0 and 360 degrees, wherein 0 degrees is defined as the starting or reference position of the mechanical output component. For another example, a status signal may represent the angular velocity of the mechanical output component. For yet another example, a status signal may represent the torque of the mechanical output component. In conjunction with a closed feedback loop, a status signal can be used to improve the accuracy of the rotational velocity, position, or torque of a mechanical output component. In like manner, a status signal can be utilized to reduce undesirable torque ripple and improve the efficiency of an electrical motor by controlling the timing of the energizations and deenergizations of the windings of an electrical motor.

A synchro is one well-known device for generating electrical signals which bear a relationship to the status of a movable component. A synchro control transmitter is an example of a synchro. A synchro control transmitter accepts an analog reference excitation at its rotor terminals and produces a three-wire set of analog synchro signals at its stator terminals. The three-wire set of analog synchro signals is at the reference frequency. The amplitude ratios of the line-to-line voltages of the three-wire set of analog synchro signals are mathematically related to the angular position of a movable component relative to a reference position. As a result, the amplitude ratios of the line-to-line voltages of the three-wire set of analog synchro signals may be utilized by avionic instrumentation display units to determine the attitude or pitch of an aircraft.

In addition to the synchro control transmitter, a number of different synchro and resolver components can perform the same general function. In particular, synchro control transformers, control differential transmitters, transolvers, and Scott-T transformers may be utilized to generate electrical signals which bear a relationship to the rotational position of a rotor shaft. Similarly, transducers such as potentiometers, brush encoders, optical encoders, and RVDTs/LVDTs may also be employed to achieve the same general result.

The analog output signals from such components may be used to control the operation of a servomechanism. In addition, the analog output signals from such components may be converted to digital signals for subsequent use by a digital computing device, such as a microprocessor, to control the operation of a servomechanism. However, while effective for many applications, synchros can generate analog synchro signals which are not truly accurate representations of the status of a mechanical output component. For instance, errors may be generated in the structure of the synchro which can cause the analog synchro signals to vary in amplitude, offset, and quadrature. Errors may also be introduced when the analog synchro signals are processed by the other components in a servomechanism. Consequently, these errors can reduce the accuracy of a status signal.

Synchro-to-digital converter chips and other electronic hardware may be used to attempt to compensate for errors in the analog synchro signals. However, such hardware may only be effective for correcting errors that remain relatively constant over a period of time. These hardware devices may not be effective for correcting errors that vary over time. In addition, a relatively large number of these devices may be required in a servomechanism since these devices may only have a limited number of inputs and outputs. Consequently, these hardware devices may increase the cost and reduce the reliability of the servomechanism.

It is known to use digital signal processing technology to compensate for errors in the analog output signals from resolver components. Such technology can compensate for errors that vary over time as well as errors that remain relatively constant over a period of time. However, the current state of known digital signal processing technology cannot compensate for errors in the analog output signals from synchros.

In light of the shortcomings in the known art, there is a need to use software-based digital signal processing technology to correct errors in the synchro signals so that the status signal is truly representative of the status of a mechanical output component. A need also exists to use software-based digital signal processing technology to correct for constant and time-varying errors in the synchro signals. Another need exists to use software-based digital signal processing technology which can accept a greater number synchro inputs as compared to the known art. Similarly, a need exists for a generic card in the software-based digital signal processing circuit which is adapted to accept a plurality of inputs which are not limited to the specific inputs of a particular customer.

Preferred embodiments of the present invention accomplish some or all of these objectives. The present invention relates to a method and apparatus which utilizes a software-based digital signal processing circuit to generate a signal which is representative of the status of a movable component. A preferred embodiment of the software-based digital signal processing circuit preferably improves the accuracy of a servomechanism. A preferred embodiment of the software-based digital signal processing circuit may also reduce the cost of the servomechanism by eliminating the need for special synchro-to-digital converter chips or other error-correcting hardware.

A preferred embodiment of the apparatus of the present invention includes a synchro which is connected to a movable component. An analog reference excitation may be generated, or a digital reference signal may be generated and converted to an analog reference excitation by a digital-to-analog converter or any other suitable device. The analog reference excitation is applied to the synchro, and the synchro generates analog synchro signals which bear a relationship to the status of the movable component. The analog synchro signals are converted to digital synchro signals by a plurality of analog-to-digital converters. If necessary, the plurality of analog-to-digital converters may also convert the analog reference excitation to a digital reference signal. The digital synchro signals and the digital reference signal are provided to a software-based digital signal processing circuit which preferably corrects constant and time-varying errors in the digital synchro signals and generates a status signal which is representative of the status of the movable component. For instance, the status signal may represent the angular position of the movable component. A different embodiment of the status signal may represent the angular velocity of the movable component.

The software-based digital signal processing circuit may include a microprocessor. The software-based digital signal processing circuit may simultaneously accept multiple sets of synchro signals. In fact, a preferred embodiment of the software-based digital signal processing circuit may accept approximately 88 sets of synchro signals. Consequently, a preferred embodiment of the software-based digital signal processing circuit preferably eliminates the need for discrete synchro decoders for each set of synchro signals.

In addition, a preferred embodiment of the software-based digital signal processing circuit utilizes a software algorithm to correct for constant and time-varying errors in the digital synchro signals. For instance, a preferred embodiment of the software-based digital signal processing circuit may factor out signal attenuation, insure quadrature, and/or reduce phase shift variation of the digital synchro signals prior to determining the status signal.

A generic card may be used in the software-based digital signal processing circuit. The software algorithm may be stored on a card separate from the generic card. The generic card is preferably adapted to accept a plurality of inputs which are not limited to the specific inputs of a particular customer. As a result, the same type of generic card may be used for substantially all customers even though they may use different inputs, thereby eliminating the need for a special card for each customer or each type of inputs. With a preferred embodiment of the generic card, only the software needs to be reconfigured to adapt the generic card to handle the specific inputs of a particular customer. The software may be reconfigured in the field by reprogramming a flash EPROM. The generic card preferably does not have to be removed from the chassis or replaced in order to reprogram the flash EPROM.

In addition to the novel features and advantages mentioned above, other objects and advantages of the present invention will be readily apparent from the following descriptions of the drawings and preferred embodiments.

DETAILED DESCRIPTION OF PREFERRED EMBODIMENT(S)

The present invention is directed to a method and apparatus which uses a software-based digital signal processing circuit to generate a status signal which is representative of the status of a movable component. In performing this function, a preferred embodiment of the present invention eliminates the need for special synchro-to-digital converter chips and error-correcting hardware. In addition, a preferred embodiment of the present invention may improve the accuracy of a servomechanism by correcting for constant and time-varying errors in the synchro signals.

Figure 1:
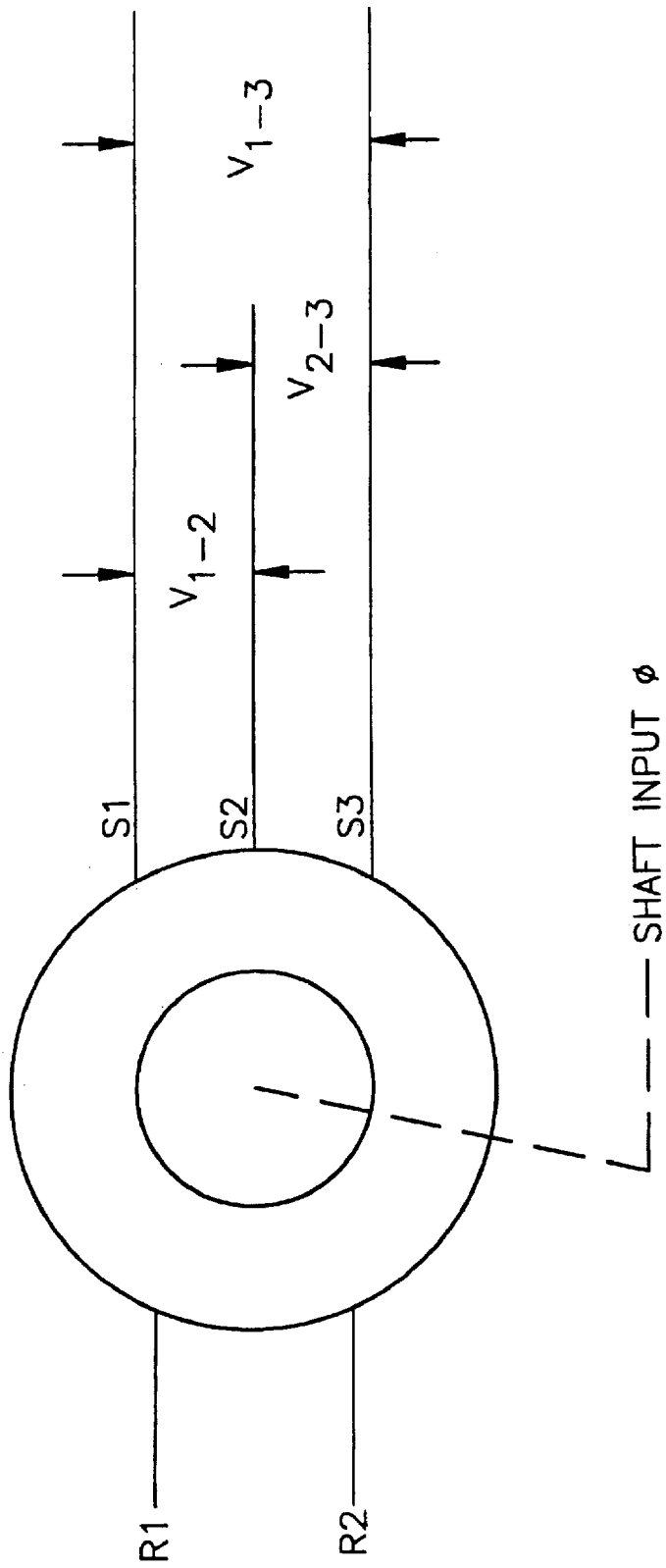
FIG. 1 is a symbolic diagram of a preferred embodiment of the synchro.

FIG. 1 is a symbolic diagram of a preferred embodiment of a synchro. It is well understood in the art that a synchro may be connected to a movable component. For example, a synchro may be connected to a motor that includes a stationary stator and an output shaft or rotor. The synchro accepts an analog reference excitation R1, R2 at its rotor terminals, and the synchro generates analog synchro signals S1, S2, S3 at its synchro terminals. The analog synchro signals S1, S2, S3 are at the reference frequency. It is well known in the art that the amplitude ratios of the line-to-line voltages $V_{1-2}$, $V_{2-3}$, and $V_{1-3}$ bear an explicit mathematical relationship to the angular position of the movable component relative to a reference position.

In a preferred method of the present invention, the analog reference excitation is converted to a digital reference signal, and the analog synchro signals are converted to digital synchro signals. A plurality of analog-to-digital converters or any other suitable device or devices may be used to digitize the signals. The digital reference signal and the digital synchro signals are then provided to a software-based digital signal processing circuit. The software-based digital signal processing circuit uses the digital reference signal and the digital synchro signals to determine a status signal that is representative of the status of the movable component.

Figure 2:
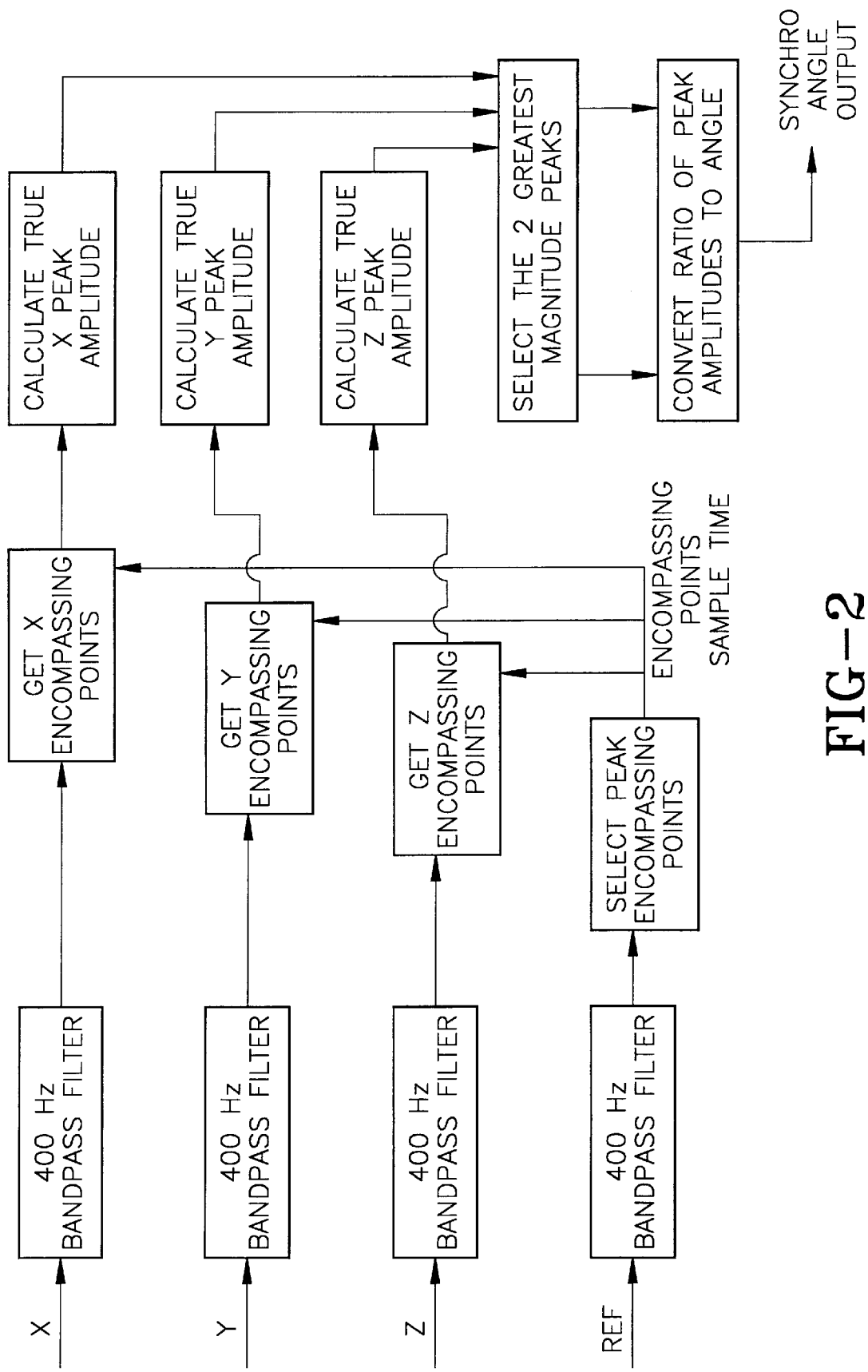
FIG. 2 is a flow diagram illustrating the steps that a preferred embodiment of the software-based digital signal processing circuit takes in order to determine the status signal.
Figure 3:
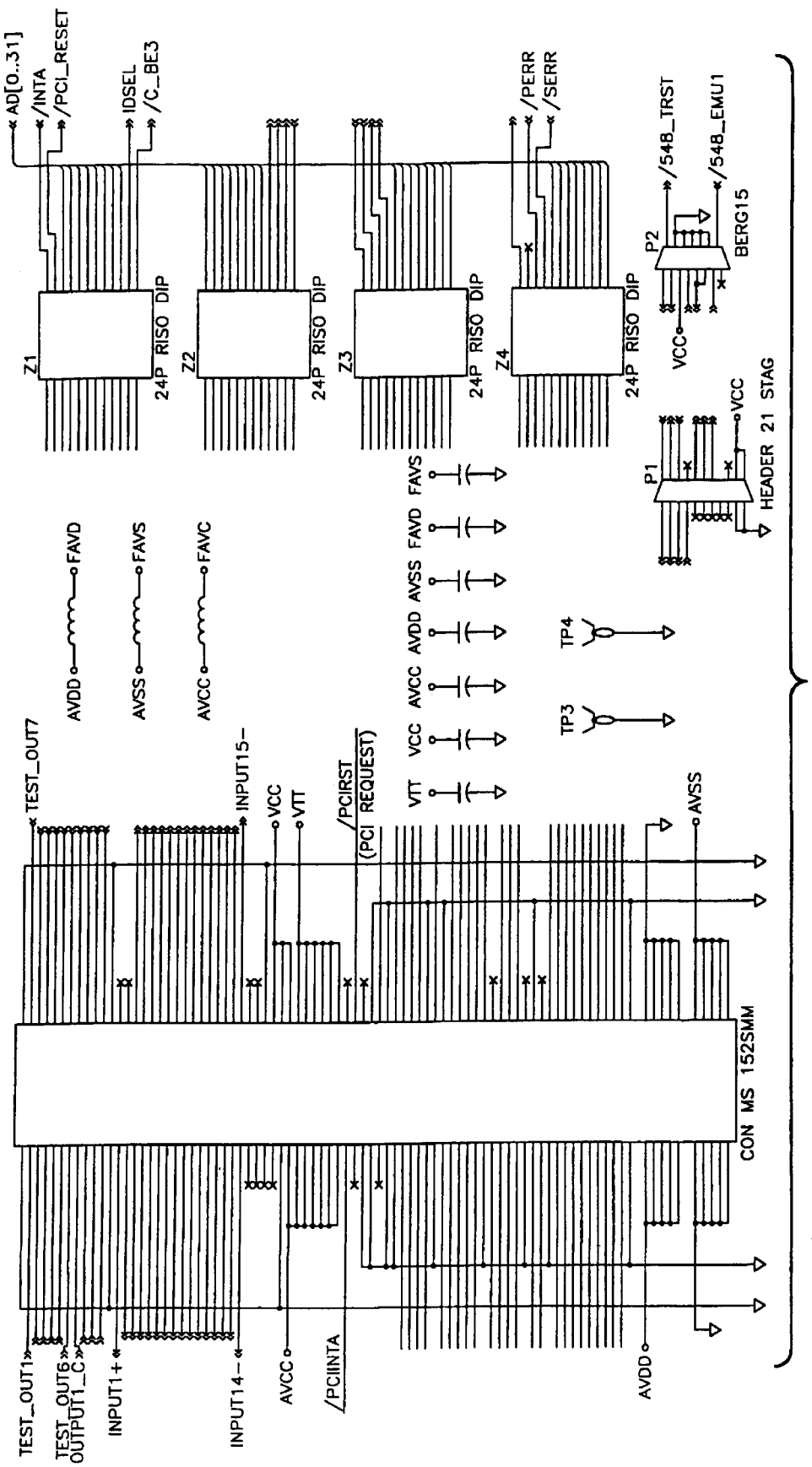
FIGS. 3 through 20 are schematic diagrams of a preferred embodiment of the generic card of a software-based digital signal processing circuit.
Figure 4:
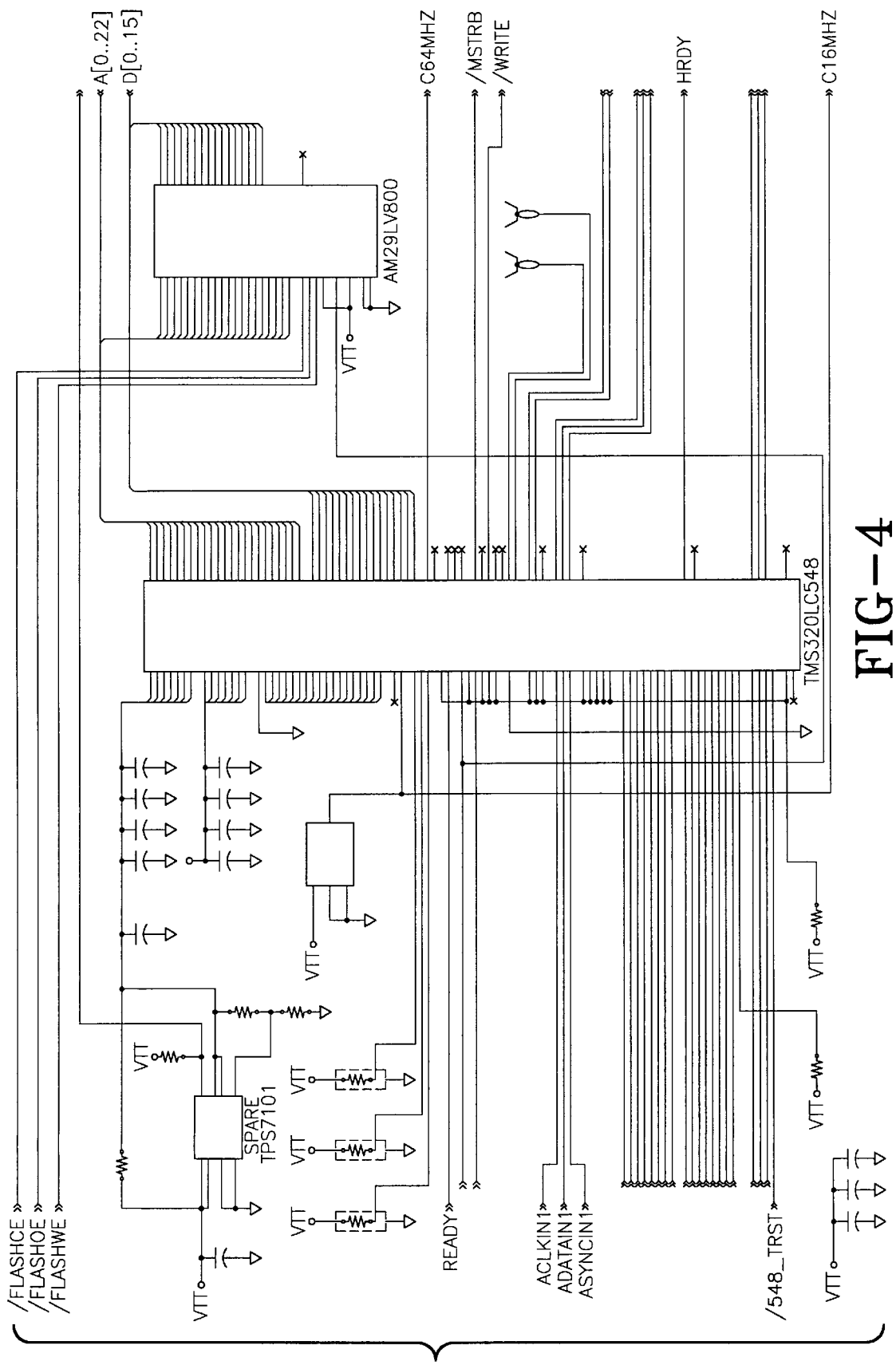
Figure 5:
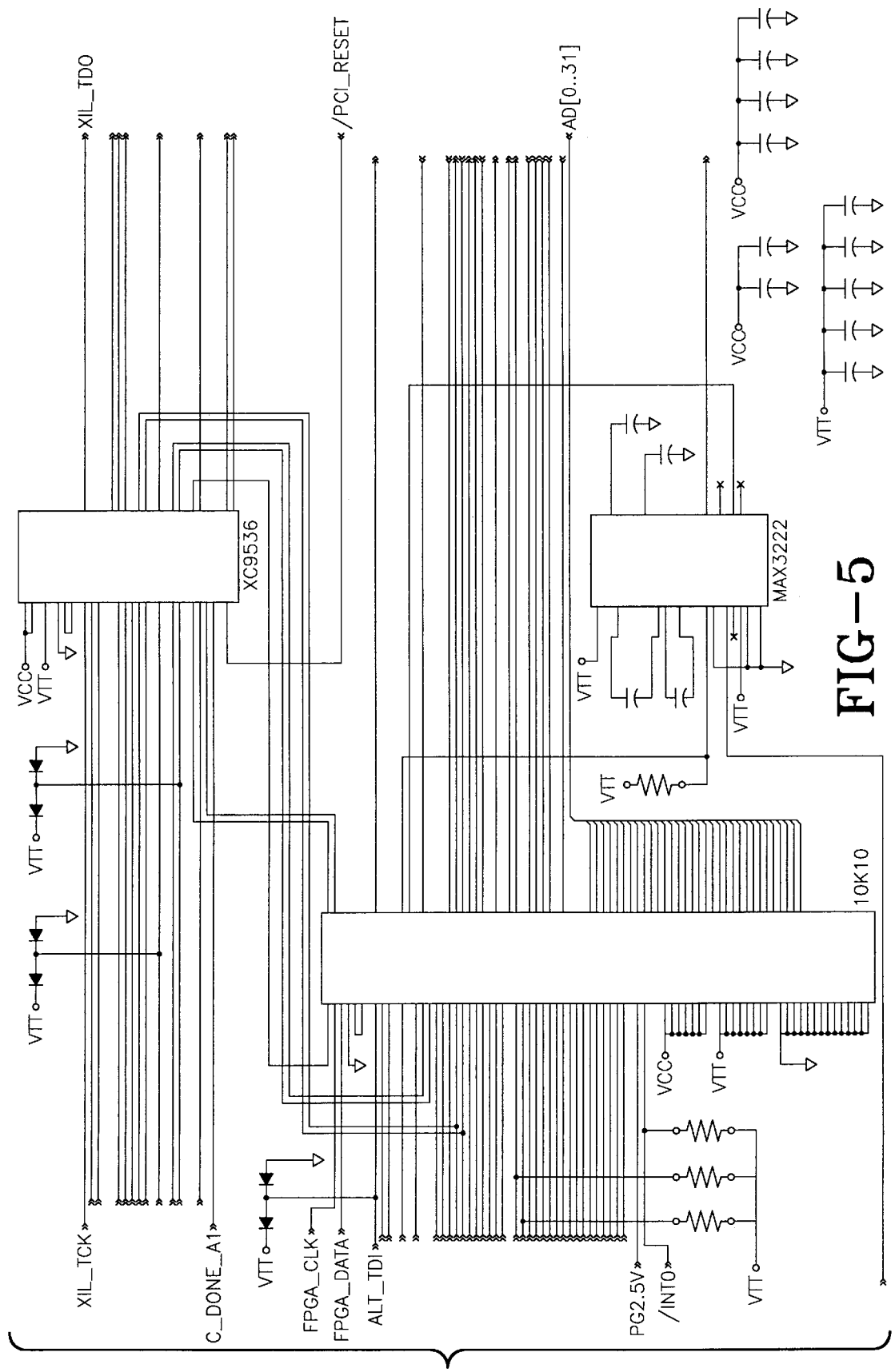
Figure 6:
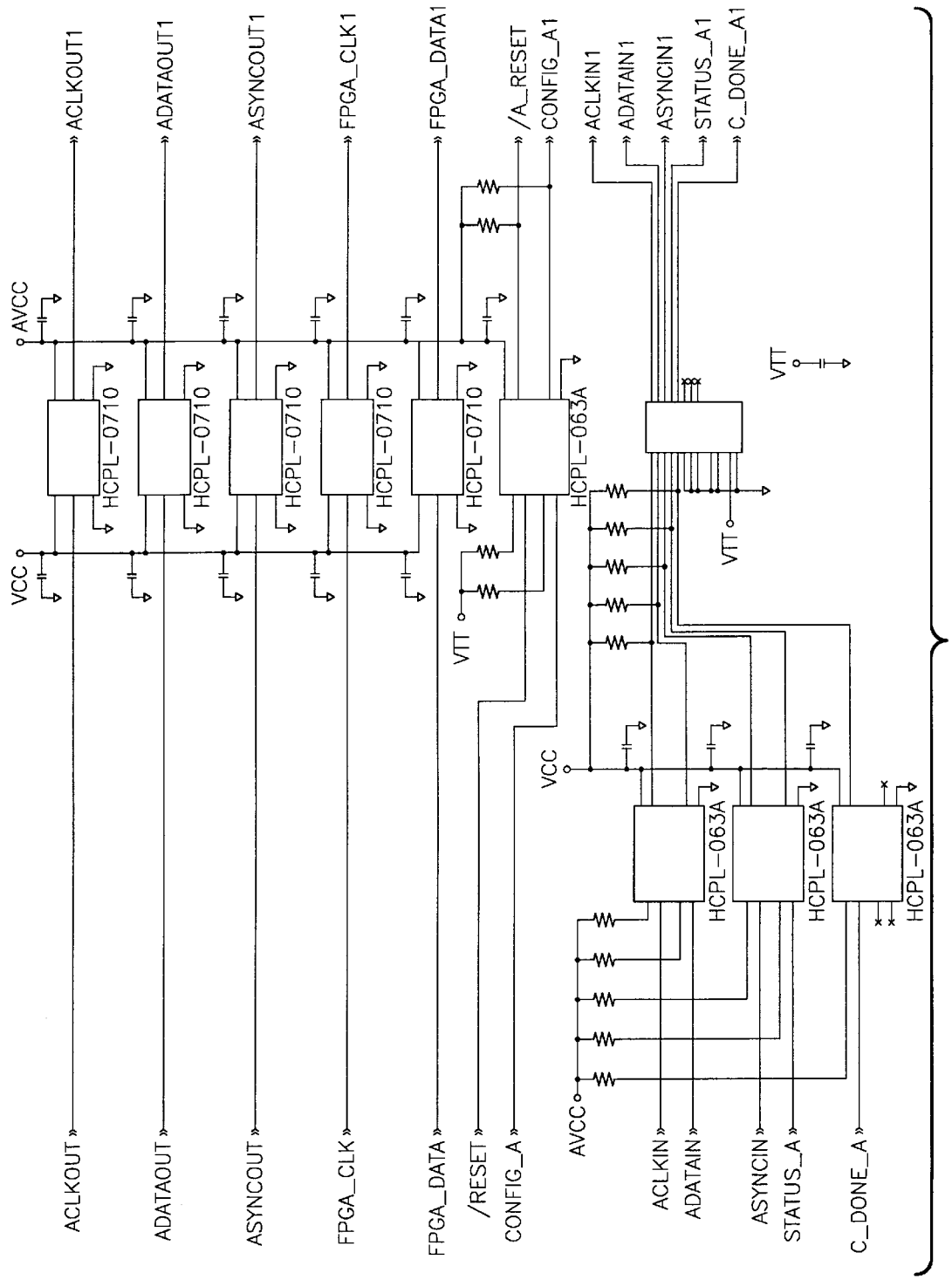
Figure 7:
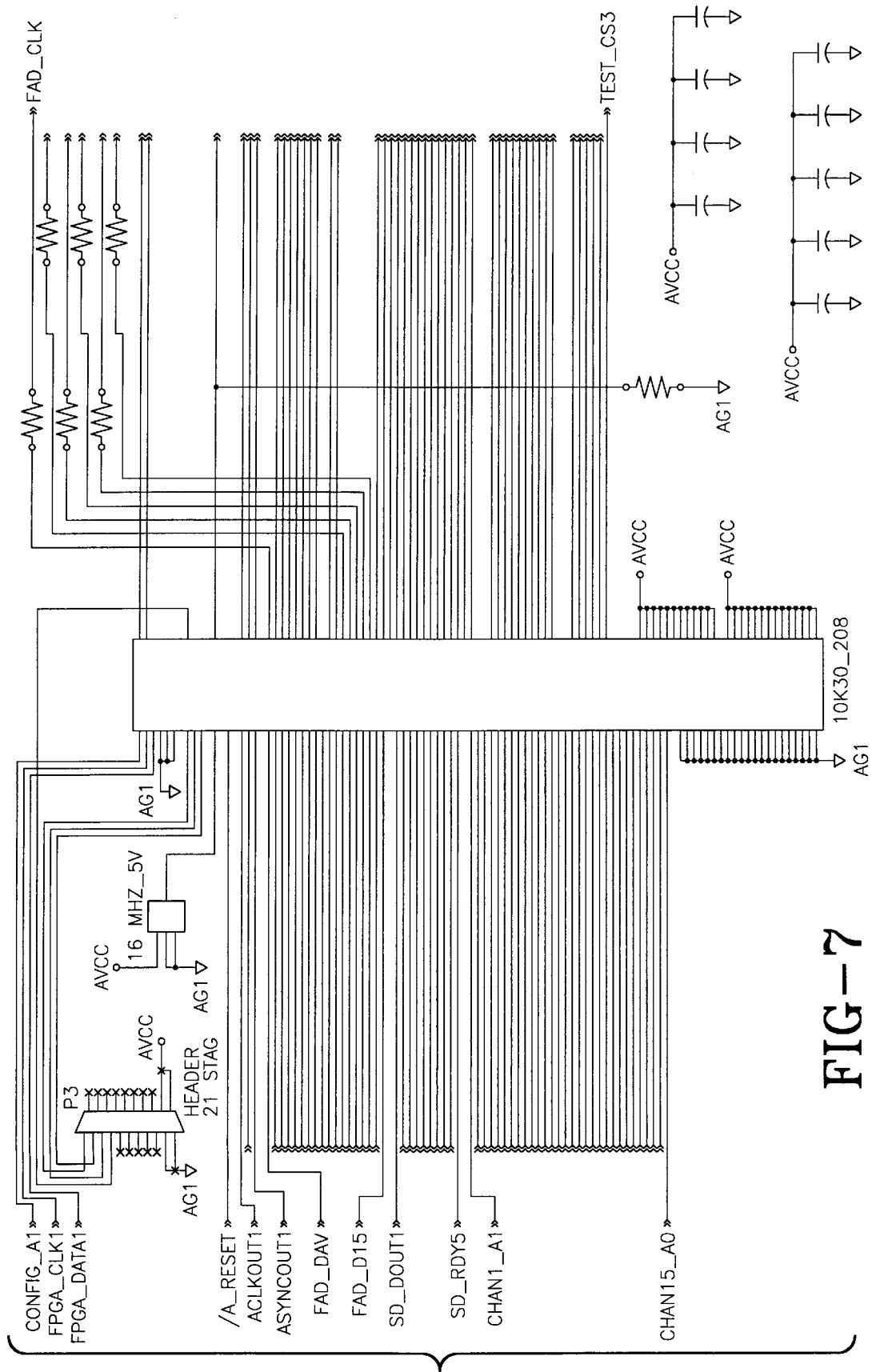
Figure 8:
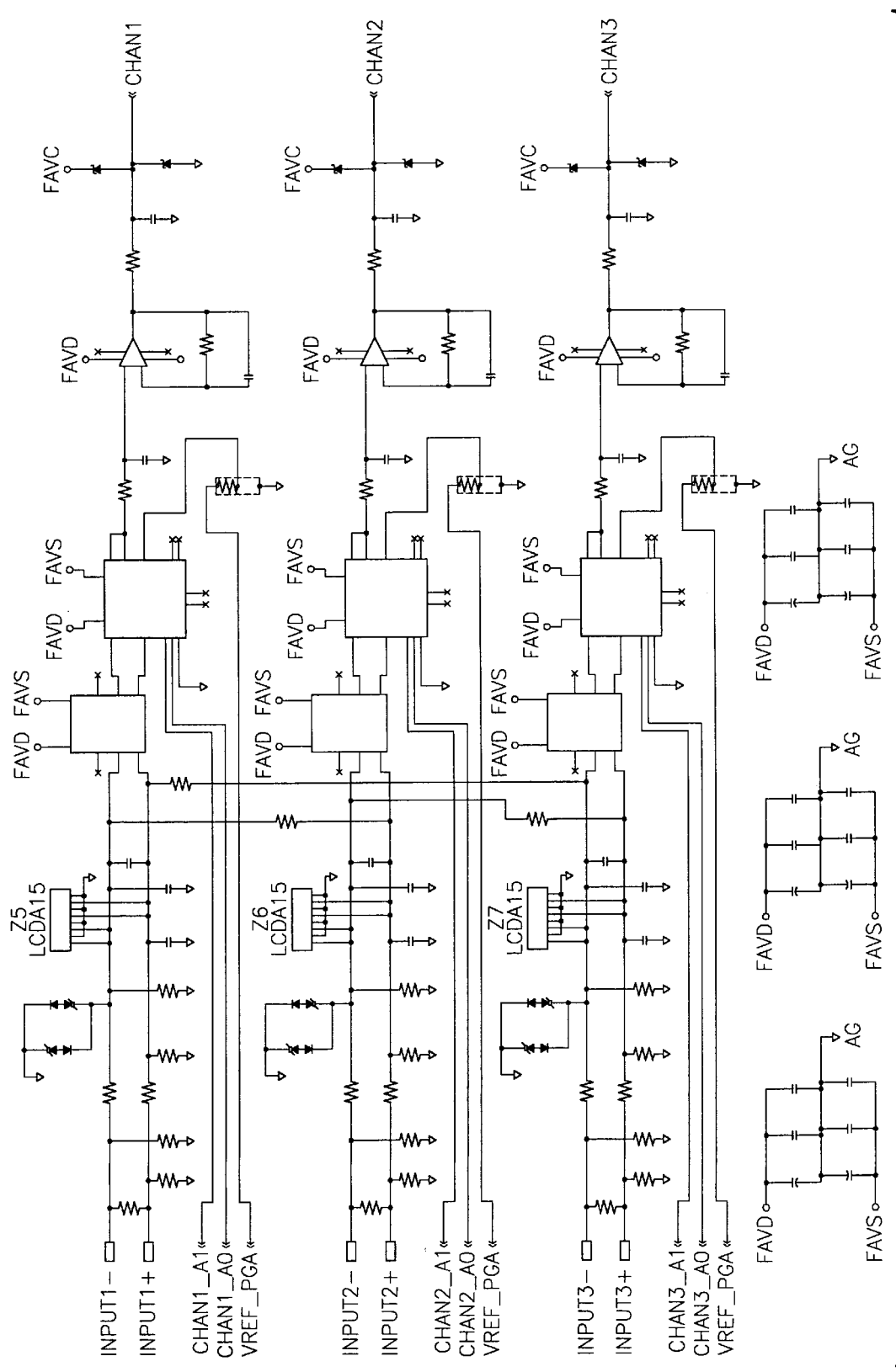
Figure 9:
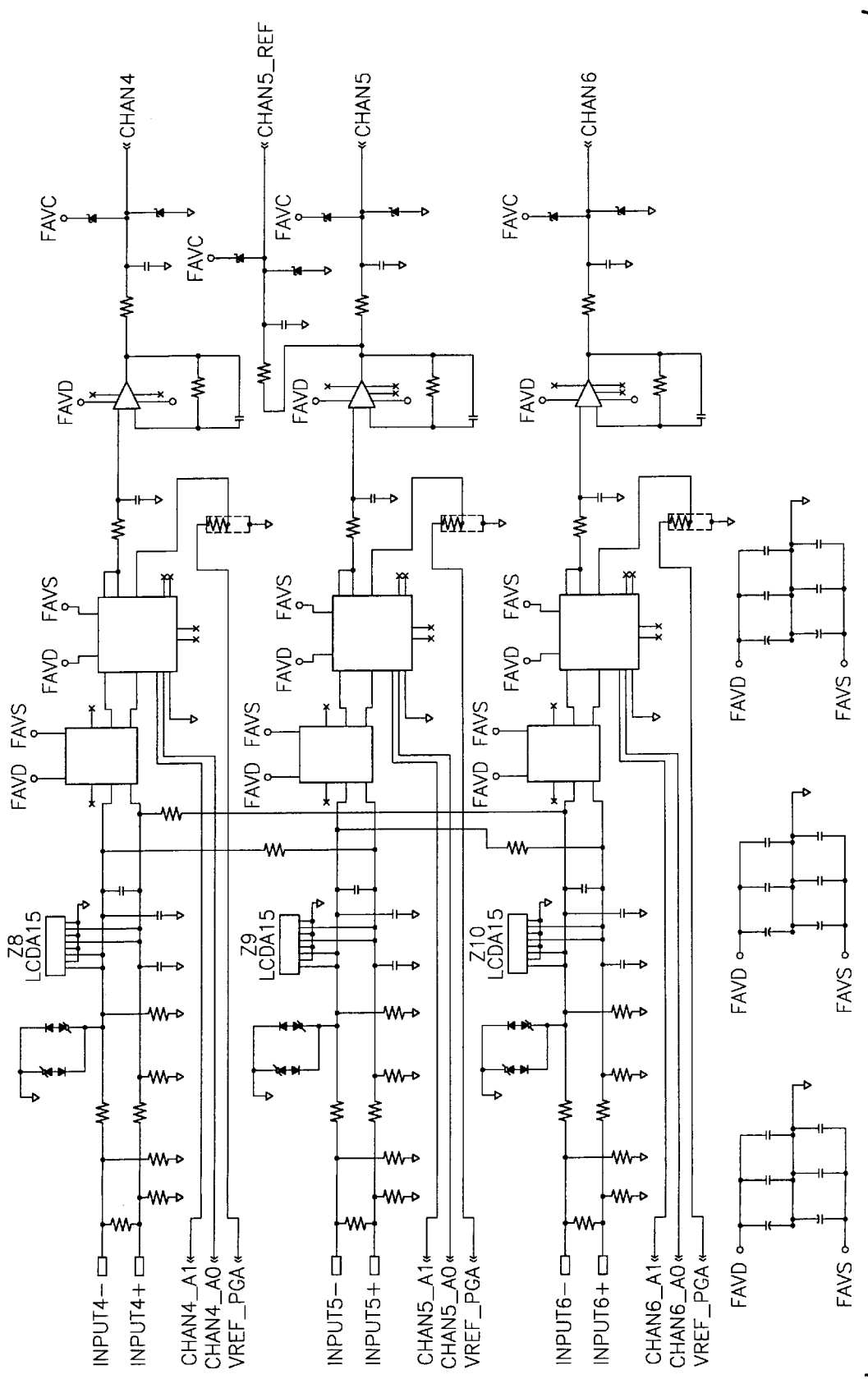
Figure 10:
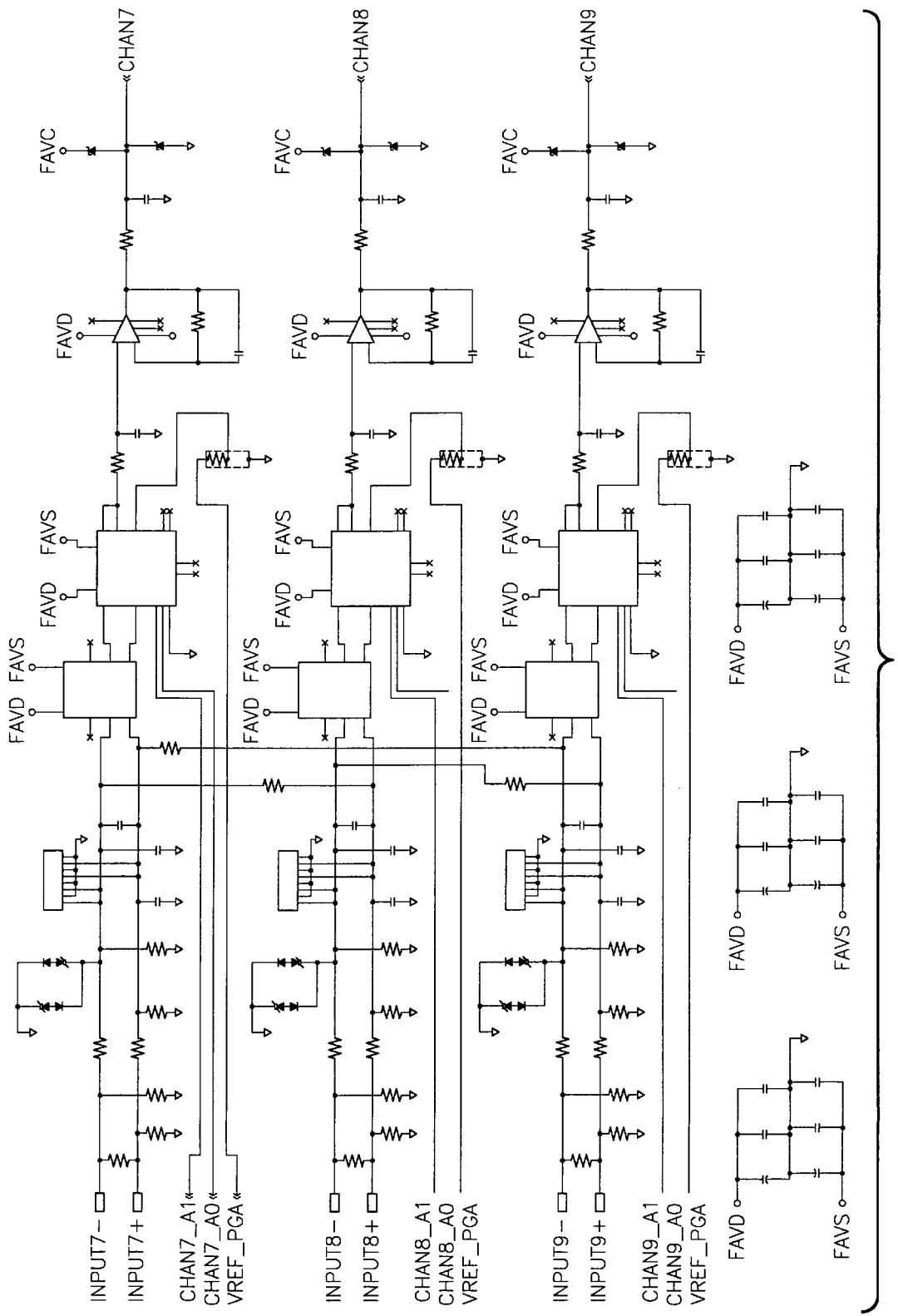
Figure 11:
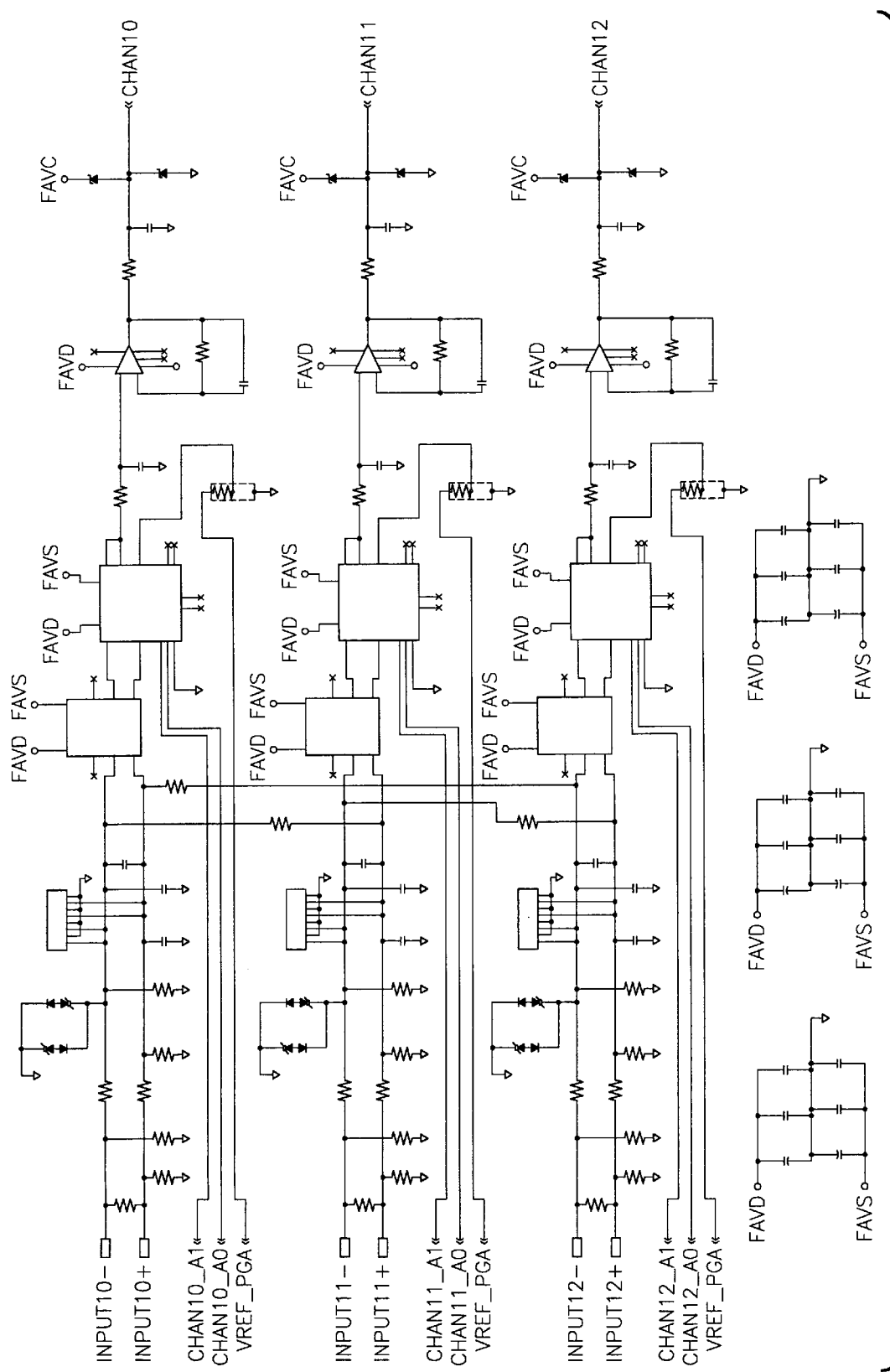
Figure 12:
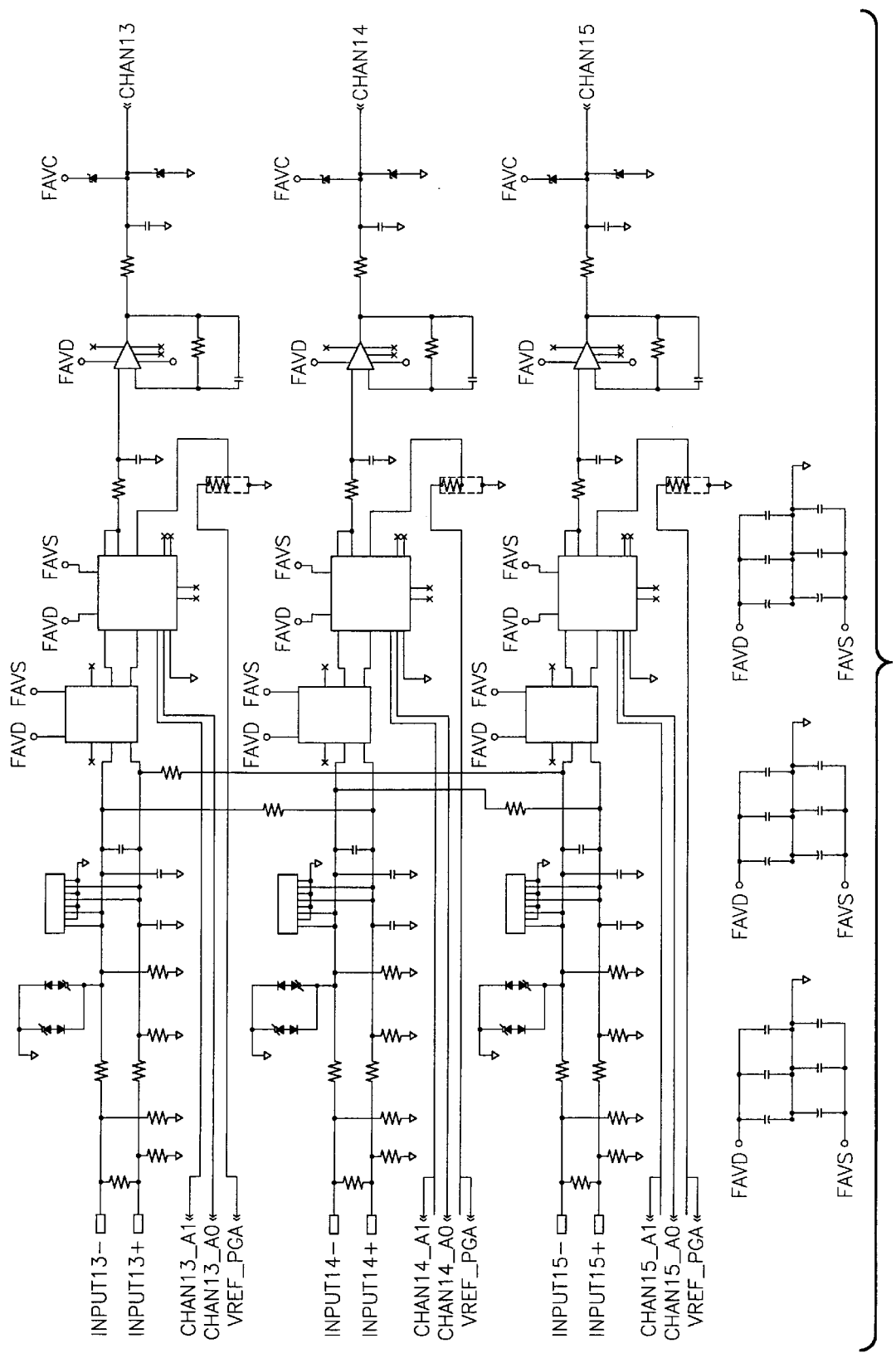
Figure 13:
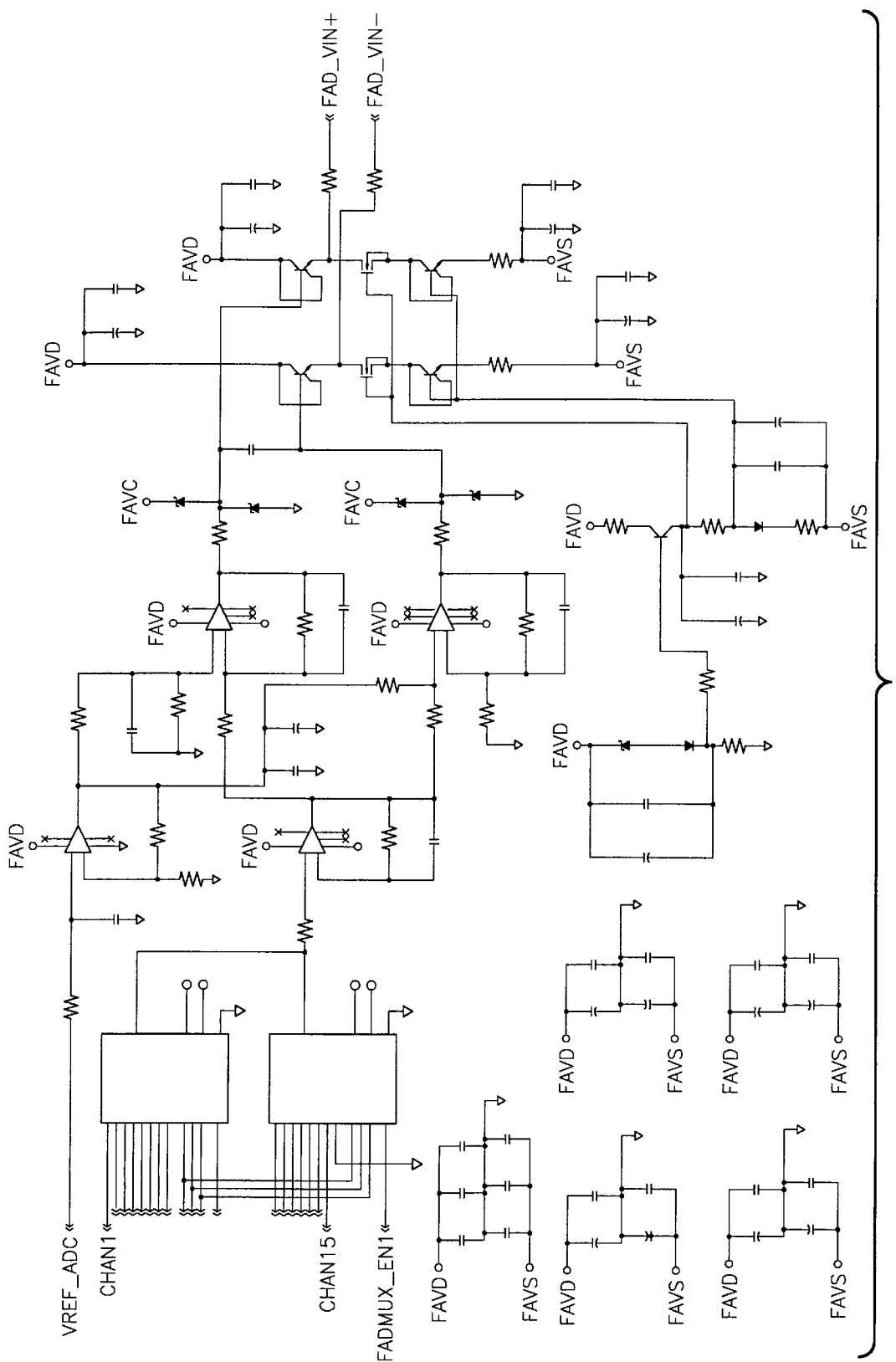
Figure 14:
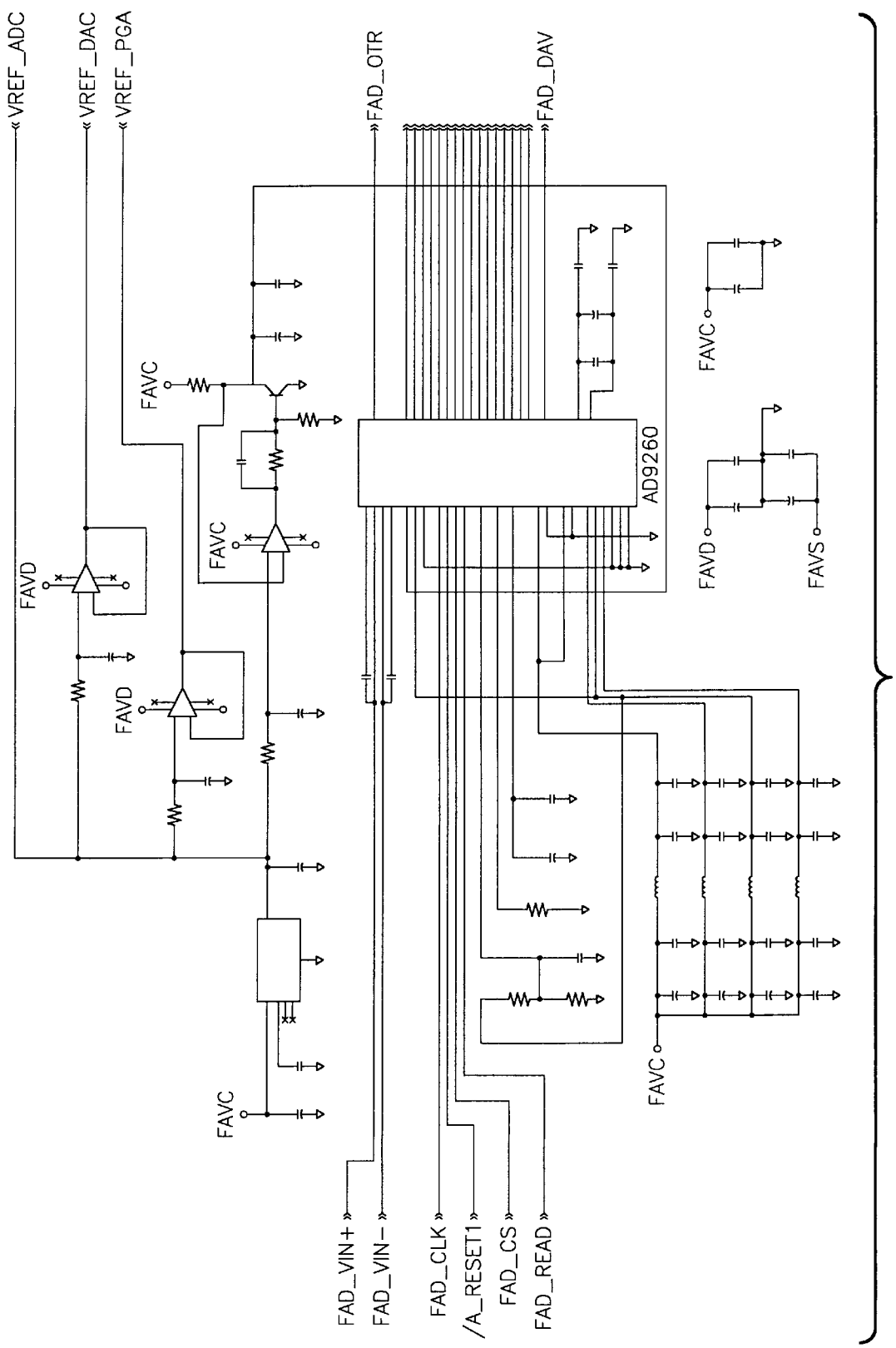
Figure 15:
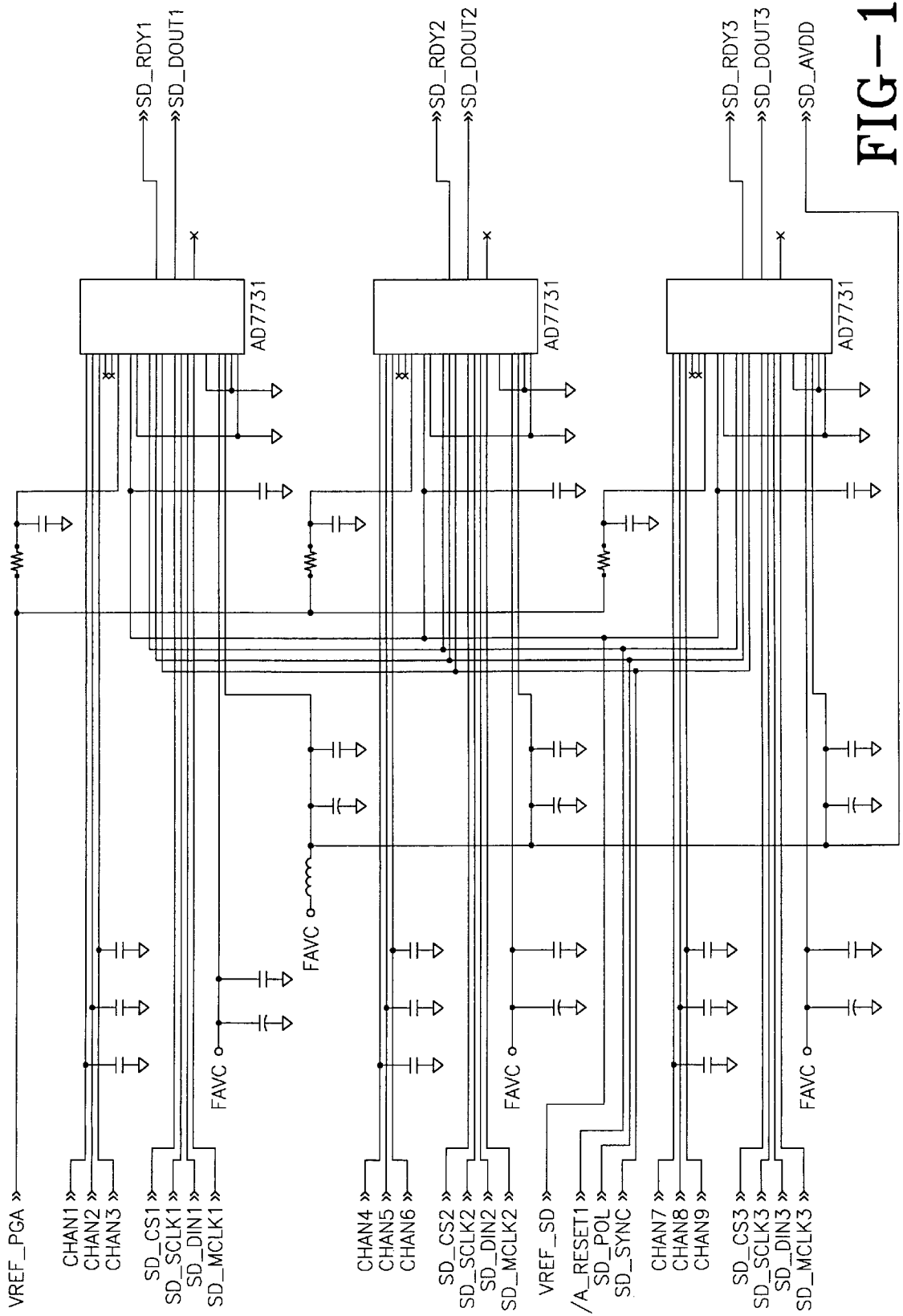
Figure 16:
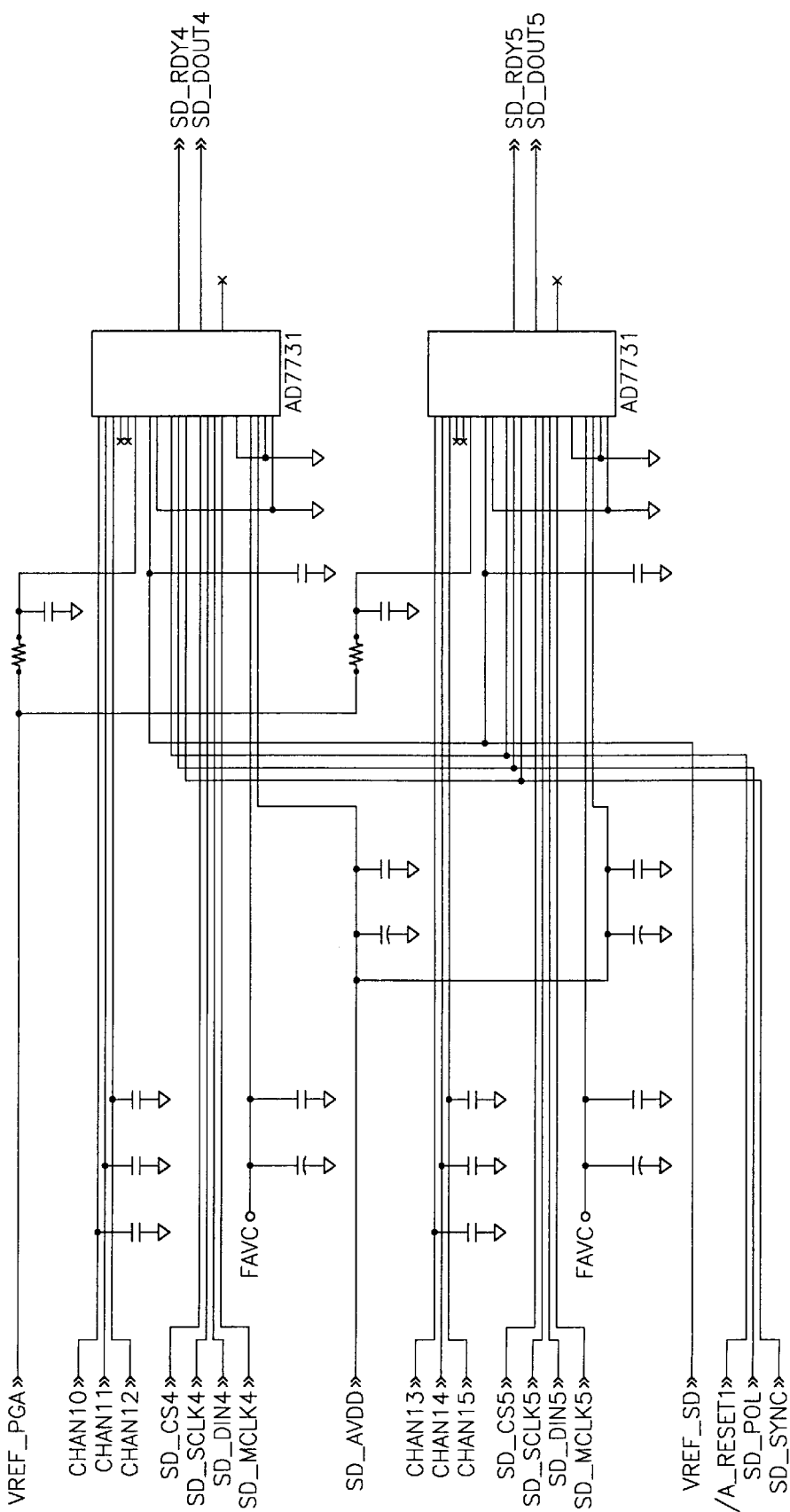
Figure 17:
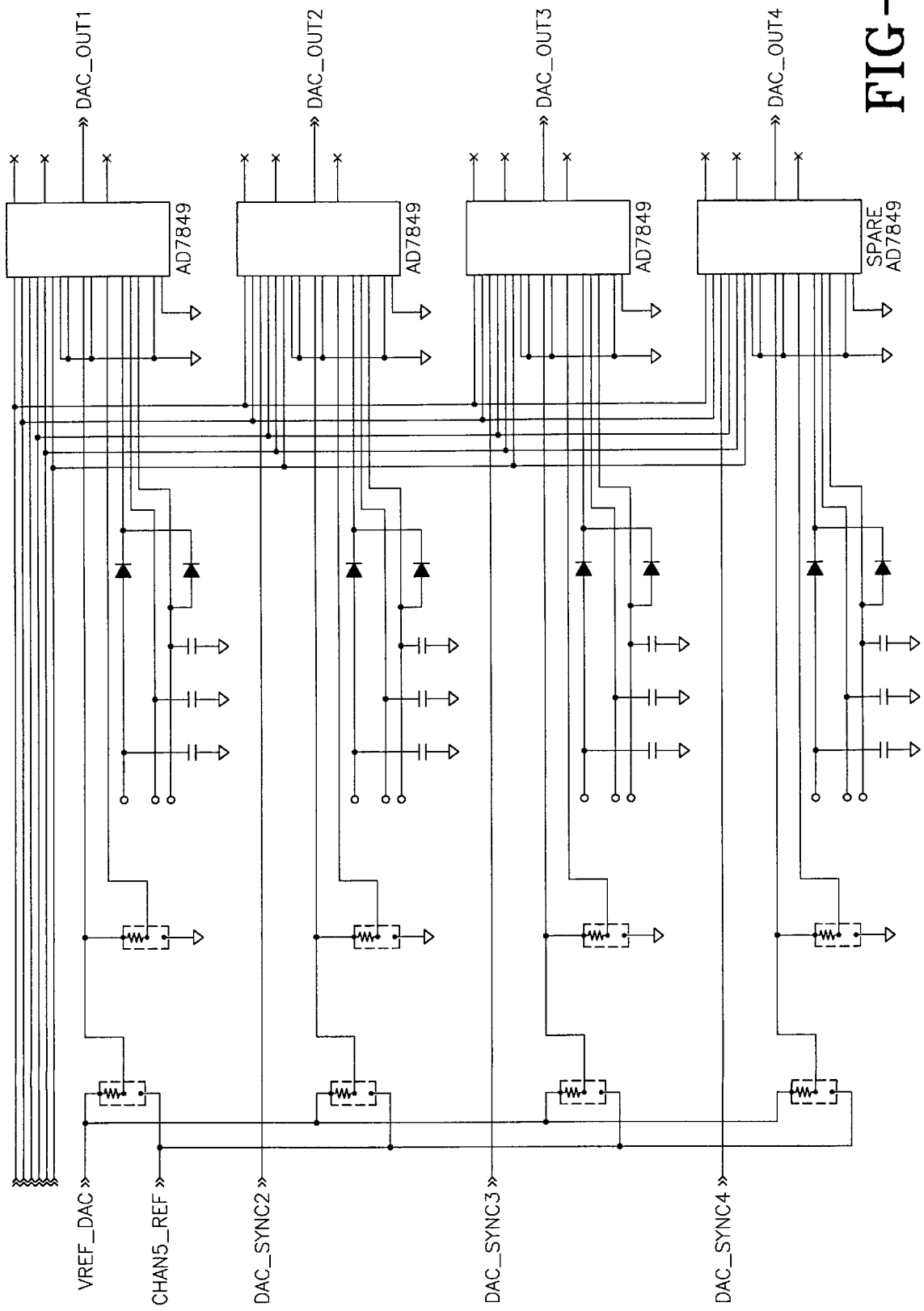
Figure 18:
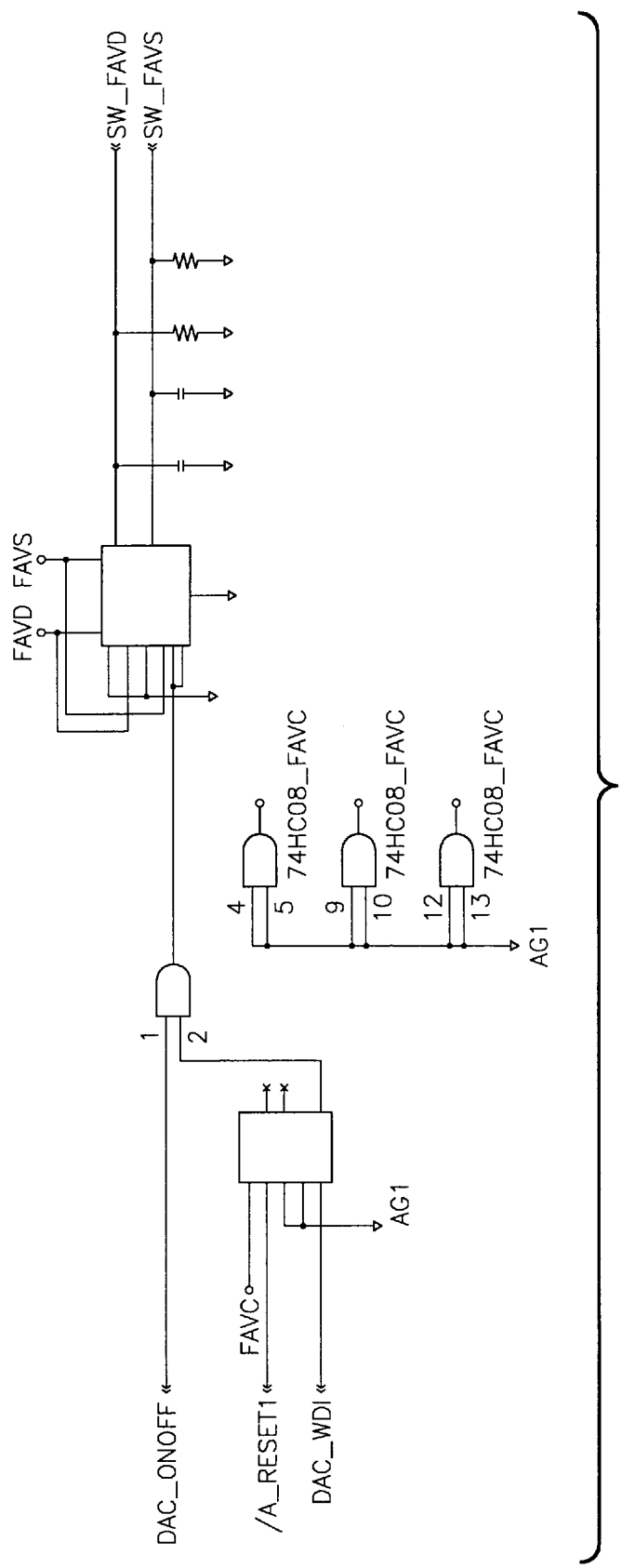
Figure 19:
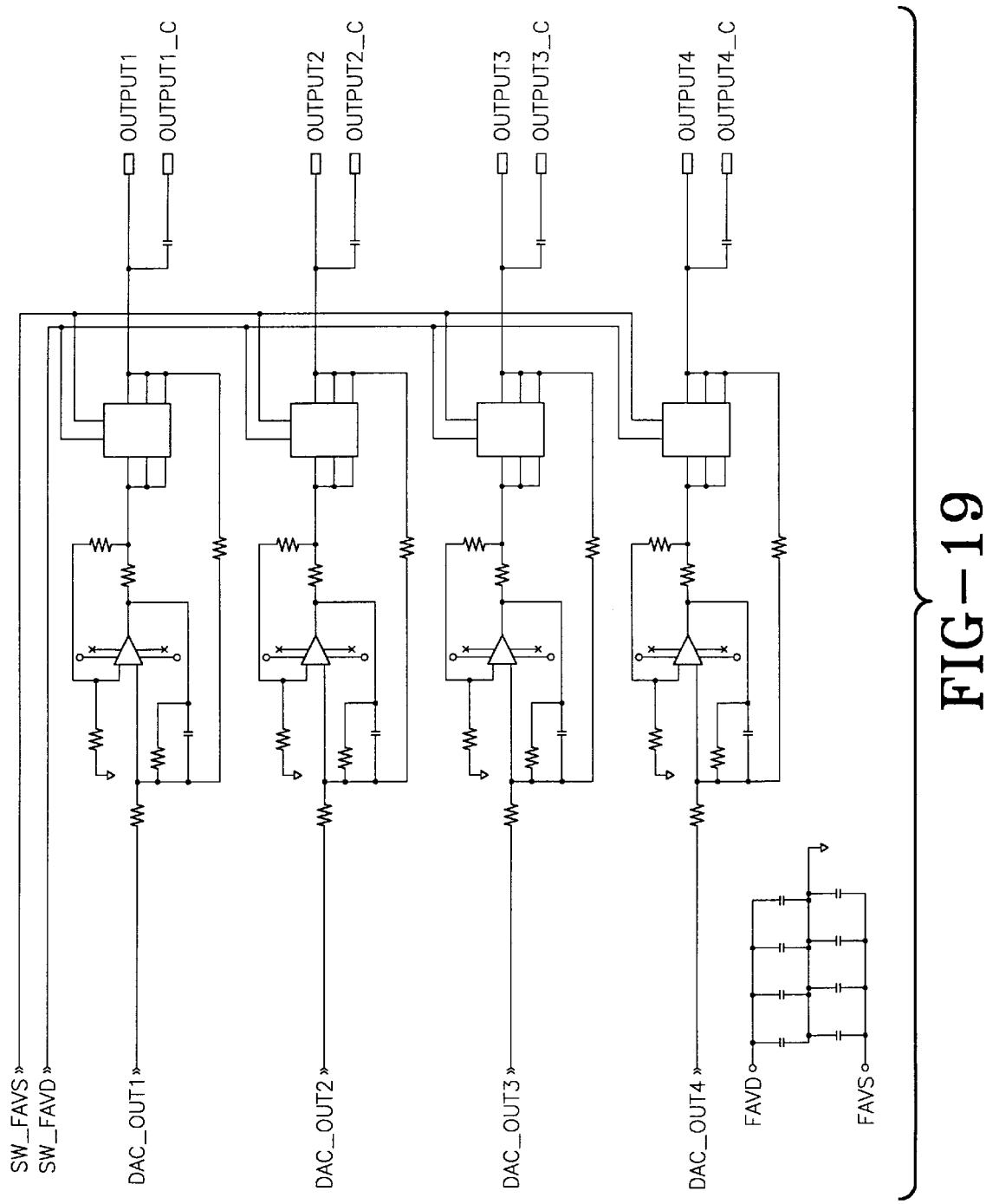
Figure 20:
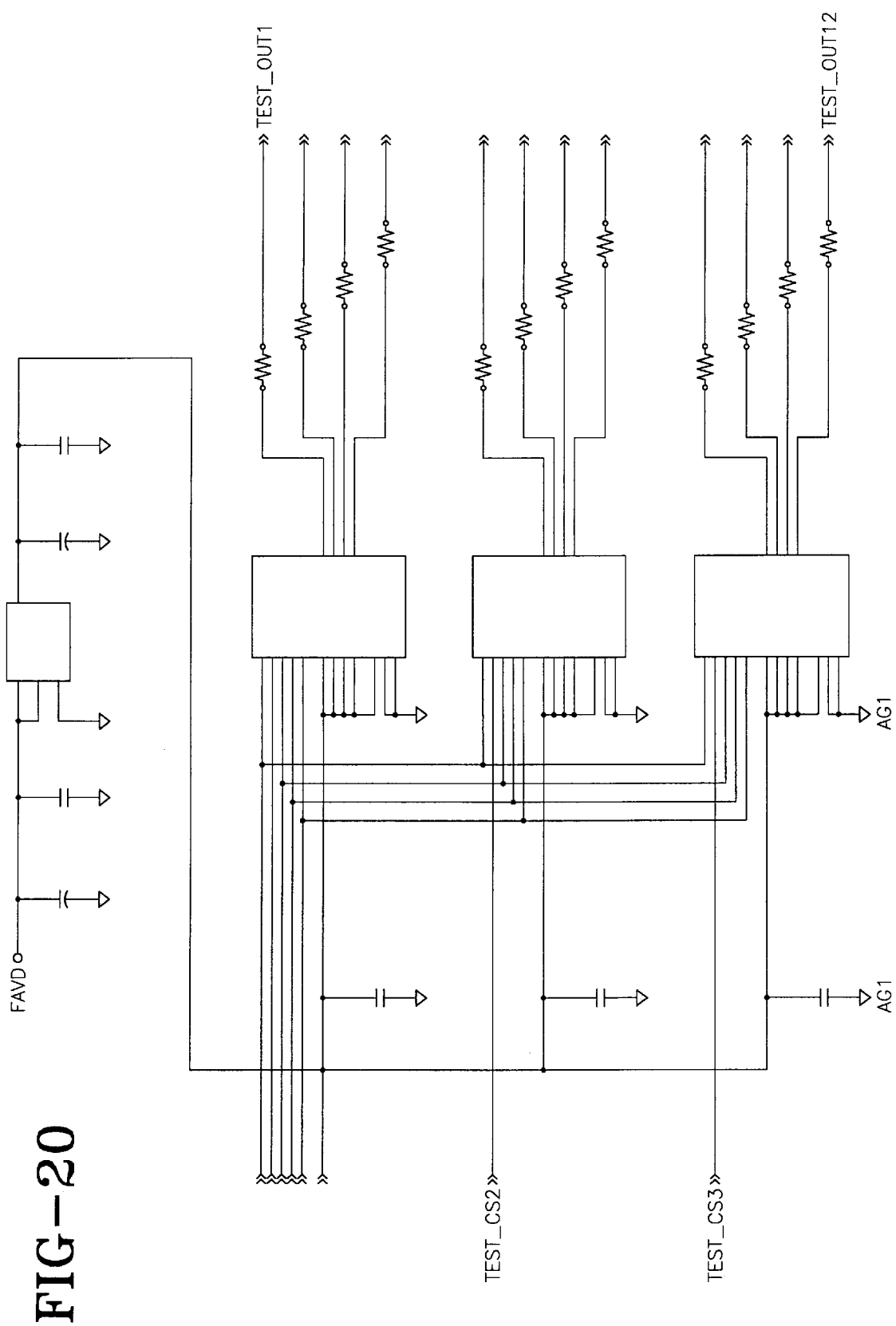

FIG. 2 is a flowchart illustrating the steps that a preferred embodiment of the software-based digital signal processing circuit may take in order to determine the status signal. In FIG. 2, digital synchro signals X, Y, and Z and digital reference signal Ref are input to a software-based digital signal processing circuit. It is preferred to filter the digital reference signal and the digital synchro signals to reduce signal noise prior to determining the status signal. In this embodiment, the software-based digital signal processing circuit bandpass filters the digital reference signal and the digital synchro signals.

Next, the software-based digital signal processing circuit preferably searches for the peak of each signal. Depending on the sample rate, it may not be possible to guarantee that a sample will fall exactly on the peak of a signal. Therefore, it is preferred to find two samples for each signal that encompass its peak amplitude. The digital reference signal REF is preferably always at full amplitude. Therefore, the search is preferably performed initially on the digital reference signal REF. The software-based digital signal processing circuit may sample the digital reference signal REF to determine two peak encompassing points of the digital reference signal REF. For example, the software-based digital signal processing circuit may scan the samples to find where the rate of change between two samples changes signs. The software-based digital signal processing circuit may then determine the sample time for the two peak encompassing points of the digital reference signal REF.

The software-based digital signal processing circuit preferably uses the sample time to retrieve two peak encompassing points from each of the digital synchro signals. The software-based digital signal processing circuit may use this information to determine the peak amplitudes of the digital synchro signals. For example, the general signal equation is:

data=TruePeak×Sin[$A$]

For each digital synchro signal, there are two peak encompassing points (for example, data0 and data1). This provides the following equations:

data0=TruePeak×Sin[$A$]

data1=TruePeak×Sin[$A$]+$dA$ where dA is a constant, known separation between the two data points, data0 and data1. This separation is based off the sample rate and is as follows:

$$dA = \frac{400 \text{ Hz} \times 360 \text{ degrees}}{\text{Sample Rate}}$$

The above equations may be solved to determine the value of TruePeak. The solution is:

$$TruePeak = \frac{\sqrt{data0^2 + data1^2 - 2 \times data0 \times data1 \times \cos[dA]}}{\sin[dA]}$$

This equation may be used to determine the true peak amplitudes of digital synchro signals X, Y, Z.

Any of the true peak amplitudes may be used to determine the synchro angle as shown below:

TruePeak of digital synchro signal $X$=Sin[SynchroAngle]

TruePeak of digital synchro signal $Y$=Sin[SynchroAngle+120 degrees]

TruePeak of digital synchro signal $Z$=Sin[SynchroAngle+240 degrees]

However, this approach has the disadvantage of not being able to factor out unaccounted signal attenuation such as losses due to the resistance in the wiring. Therefore, it is preferred to use the two highest peak amplitudes of the digital synchro signals to determine a status signal that is representative of the status of the movable component. By using the two highest peak amplitudes as determined above, unanticipated attenuation and phase shifting of the digital synchro signals may be factored out.

Under this approach, there are six possible scenarios for determining the synchro angle and the resulting status signal:

(1) If TruePeak of X>TruePeak of Y>TruePeak of Z, then use TruePeak of X and TruePeak of Y;
(2) If TruePeak of Y>TruePeak of X>TruePeak of Z, then use TruePeak of X and TruePeak of Y;
(3) If TruePeak of X>TruePeak of Z>TruePeak of Y, then use TruePeak of X and TruePeak of Z;
(4) If TruePeak of Z>TruePeak of X>TruePeak of Y, then use TruePeak of X and TruePeak of Z;
(5) If TruePeak of Z>TruePeak of Y>TruePeak of X, then use TruePeak of Y and TruePeak of Z; and
(6) If TruePeak of Y>TruePeak of Z>TruePeak of X, then use TruePeak of Y and TruePeak of Z For cases 1 and 2, the following formula may be used to determine the synchro angle:

$$SynchroAngle = ArcTan\frac{TruePeak \text{ of } X \times \text{Sin}[120 \text{ degrees}]}{TruePeak \text{ of } Y \times TruePeak \text{ of } X \times \text{Cos}[120 \text{ degrees}]}$$

For cases 3 and 4, the following formula may be used to determine the synchro angle:

$$SynchroAngle = ArcTan\frac{TruePeak \text{ of } X \times \text{Sin}[240 \text{ degrees}]}{TruePeak \text{ of } Z \times TruePeak \text{ of } X \times \text{Cos}[240 \text{ degrees}]}$$

For cases 5 and 6, the following formula may be used to determine the synchro angle:

$$SynchroAngle = ArcTan\frac{\text{Tan}[120 \text{ degrees}] \times [TruePeak \text{ of } Y + TruePeak \text{ of } Z]}{TruePeak \text{ of } Y - TruePeak \text{ of } Z}$$

The result of the above formulae generates an angle between 0 and 180 degrees. If the true synchro angle is above 180 degrees, it is preferred to perform one more test. For cases 1, 2, 3, and 4, if the true peak of X is less than zero, then 180 degrees may be added to the calculated angle to obtain a true angle in the range of 0 to 360 degrees. For cases 5 and 6, if the true peak of Y is greater than zero, then 180 degrees may be added to the calculated angle to obtain a true angle in the range of 0 to 360 degrees. As a result, the software-based digital signal processing circuit is adapted to provide a true synchro angle in the range of 0 to 360 degrees which is representative of the status of the mechanical output component. The software-based digital signal processing circuit may then send a status signal to a display processor which allows the angular position to be displayed on a display screen. Alternatively, additional well-known calculations may be performed to determine a status signal which represents the angular velocity of the movable component.

The present invention is also directed to an apparatus for generating a status signal which is representative of the status of a movable component. The movable component may be a rotatable shaft such as the rotor of a motor. A preferred embodiment of the apparatus comprises a synchro, a plurality of analog-to-digital converters, and a software-based digital signal processing circuit. An analog reference excitation is applied to the synchro, and the synchro is adapted to generate analog synchro signals which bear a relationship to the status of the mechanical output component. A plurality of analog-to-digital converters is in electrical communication with the synchro. The analog-to-digital converters are adapted to convert the analog synchro signals to digital synchro signals. In addition, the plurality of analog-to-digital converters may also be adapted to convert the analog reference excitation to a digital reference signal. The software-based digital signal processing circuit is in electrical communication with the plurality of analog-to-digital converters. The software-based digital signal processing circuit is preferably adapted to correct errors in the digital synchro signals and to generate a status signal which is representative of the status of the mechanical output component. The status signal may represent the angular position of the mechanical output component. A different embodiment of the status signal may represent the angular velocity of the mechanical output component.

The software-based digital signal processing circuit may include a microprocessor. The software-based digital signal processing circuit also preferably includes a generic card. FIGS. 3 through 20 are schematic diagrams of a preferred embodiment of the generic card. The generic card is preferably adapted to accept a plurality of inputs which are not limited to the specific inputs of a particular customer. In addition, the generic card preferably outputs signals which are processed by the software algorithm of the software-based digital signal processing circuit.

The same generic card may be used for substantially all customers even though they may have different inputs. With a preferred embodiment of the generic card, only the software may need to be reconfigured to handle the specific inputs of a particular customer. The software may be reconfigured in the field by reprogramming a flash EPROM. It is preferred that the generic card does not have to be replaced in order to reprogram the flash EPROM.

The software algorithm of the software-based digital signal processing circuit preferably corrects constant and time-varying errors in the digital synchro signals. A preferred embodiment of the software-based digital signal processing circuit factors out any amplitude variation of any of the peak amplitudes of the digital synchro signals prior to generating the status signal. The software-based digital signal processing circuit may also reduce any phase shift variation of any of the digital synchro signals prior to generating the status signal.

The present invention further includes a servomechanism comprising a motor, a synchro, a plurality of analog-to-digital converters, and a software-based digital signal processing circuit. The motor has a stator and a rotor, and the rotor is driven to rotate about an axis relative to the stator. The synchro is adapted to generate analog synchro signals which bear a relationship to the status of the rotor. The plurality of analog-to-digital converters is in electrical communication with the synchro. The plurality of analog-to-digital converters is adapted to convert the analog synchro signals to digital synchro signals. The software-based digital signal processing circuit is in electrical communication with the plurality of analog-to-digital converters. The software-based digital signal processing circuit is adapted to correct errors in the digital synchro signals and to generate a status signal which is representative of the status of the rotor.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A method for generating a status signal which is representative of the status of a movable component, said method comprising:

determining two peak encompassing points of a digital synchro signal;

determining a peak amplitude of said digital synchro signal using said two peak encompassing points; and determining said status signal using at least said peak amplitude of said digital synchro signal.

2. The method of claim 1 further comprising:

providing a digital reference signal;

sampling said digital reference signal;

determining two peak encompassing points of said digital reference signal; and determining a sample time of said two peak encompassing points of said digital reference signal;

wherein said two peak encompassing points of said digital synchro signal are determined using said sample time.

3. The method of claim 1 wherein determining said status signal further includes factoring out attenuation of said digital synchro signal.

4. The method of claim 3 wherein attenuation of said digital synchro signal is factored out by:

comparing said peak amplitude of said digital synchro signal with other peak amplitudes of other digital synchro signals;

determining the two highest of said peak amplitude and said other peak amplitudes; and determining said status signal using the two highest of said peak amplitude and said other peak amplitudes.

5. The method of claim 1 wherein said method is substantially performed by a software-based circuit.

6. The method of claim 5 wherein said software-based circuit is comprised of a microprocessor.

7. The method of claim 1 wherein said status signal represents the angular position of said movable component.

8. The method of claim 1 wherein said status signal represents the angular velocity of said movable component.

9. A method for generating a status signal which is representative of the status of a movable component, said method comprising:

providing a digital reference signal and a digital synchro signal;

sampling said digital reference signal;

determining two peak encompassing points of said digital reference signal;

determining two peak encompassing points of said digital synchro signal;

determining a peak amplitude of said digital synchro signal using said two peak encompassing points of said digital synchro signal; and determining said status signal using at least said peak amplitude of said digital synchro signal.

10. The method of claim 9 wherein determining said status signal further includes factoring out attenuation of said digital synchro signal.

11. The method of claim 10 wherein attenuation of said digital synchro signal is factored out by:

comparing said peak amplitude of said digital synchro signal with other peak amplitudes of other digital synchro signals;

determining the two highest of said peak amplitude and said other peak amplitudes; and determining said status signal using the two highest of said peak amplitude and said other peak amplitudes.

12. The method of claim 9 wherein said method is substantially performed by a software-based circuit.

13. The method of claim 12 wherein said software-based circuit is comprised of a microprocessor.

14. The method of claim 9 wherein said status signal represents the angular position of said movable component.

15. The method of claim 9 wherein said status signal represents the angular velocity of said movable component.

16. A method for generating a status signal which is representative of the status of a movable component, said method comprising:

providing a digital reference signal and a digital synchro signal;

sampling said digital reference signal;

determining two peak encompassing points of said digital reference signal;

determining a sample time of said two peak encompassing points of said digital reference signal;

determining a peak amplitude of said digital synchro signal using said sample time; and determining said status signal using at least said peak amplitude of said digital synchro signal.

17. The method of claim 16 wherein determining said status signal further includes factoring out attenuation of said digital synchro signal.

18. The method of claim 17 wherein attenuation of said digital synchro signal is factored out by:

comparing said peak amplitude of said digital synchro signal with other peak amplitudes of other digital synchro signals;

determining the two highest of said peak amplitude and said other peak amplitudes; and determining said status signal using the two highest of said peak amplitude and said other peak amplitudes.

19. The method of claim 16 wherein said method is substantially performed by a software-based circuit.

20. The method of claim 19 wherein said software-based circuit is comprised of a microprocessor.

21. The method of claim 16 wherein said status signal represents the angular position of said movable component.

22. The method of claim 16 wherein said status signal represents the angular velocity of said movable component.

23. The method of claim 16 wherein:

said sample time is used to determine two peak encompassing points of said digital synchro signal; and said two peak encompassing points of said digital synchro signal are used to determine said peak amplitude of said digital synchro signal.

24. An apparatus for generating a status signal which is representative of the status of a movable component, said apparatus comprising:

a synchro connected to said movable component, said synchro adapted to generate analog synchro signals which bear a relationship to the status of said movable component;

at least one analog-to-digital converter in electrical communication with said synchro, said at least one analog-to-digital converter adapted to convert at least one of said analog synchro signals; and a circuit in electrical communication with said at least one analog-to-digital converter, said circuit adapted to determine two peak encompassing points of a digital synchro signal, determine a peak amplitude of said digital synchro signal using said two peak encompassing points, and determine said status signal using at least said peak amplitude of said digital synchro signal.

25. The apparatus of claim 24 wherein:

said circuit is further adapted to sample a digital reference signal, determine two peak encompassing points of said digital reference signal, and determine a sample time of said two peak encompassing points of said digital reference signal;

wherein said two peak encompassing points of said digital synchro signal are determined using said sample time.

26. The apparatus of claim 24 wherein said circuit is further adapted to factor out attenuation of said digital synchro signal.

27. The apparatus of claim 26 wherein said circuit is adapted to compare said peak amplitude of said digital synchro signal with other peak amplitudes of other digital synchro signals, determine the two highest of said peak amplitude and said other peak amplitudes, and determine said status signal using the two highest of said peak amplitude and said other peak amplitudes.

28. The apparatus of claim 24 wherein said circuit is a software-based circuit.

29. The apparatus of claim 28 wherein said circuit is comprised of a microprocessor.

30. The apparatus of claim 24 wherein said status signal represents the angular position of said movable component.

31. The apparatus of claim 24 wherein said status signal represents the angular velocity of said movable component.

32. A servomechanism comprising:

a mechanical component adapted to move in response to an electrical command;

a synchro adapted to generate analog synchro signals which bear a relationship the status of said mechanical component;

at least one analog-to-digital converter in electrical communication with said synchro, said at least one analog-to-digital converter adapted to convert at least one of said analog synchro signals; and a circuit in electrical communication with said at least one analog-to-digital converter, said circuit adapted to determine two peak encompassing points of a digital synchro signal, determine a peak amplitude of said digital synchro signal using said two peak encompassing points, and determine a status signal using at least said peak amplitude of said digital synchro signal.

33. The servomechanism of claim 32 wherein:

said circuit is further adapted to sample a digital reference signal, determine two peak encompassing points of said digital reference signal, and determine a sample time of said two peak encompassing points of said digital reference signal;

wherein said two peak encompassing points of said digital synchro signal are determined using said sample time.

34. The servomechanism of claim 32 wherein said circuit is further adapted to factor out attenuation of said digital synchro signal.

35. The servomechanism of claim 34 wherein said circuit is adapted to compare said peak amplitude of said digital synchro signal with other peak amplitudes of other digital synchro signals, determine the two highest of said peak amplitude and said other peak amplitudes, and determine said status signal using the two highest of said peak amplitude and said other peak amplitudes.

36. The servomechanism of claim 32 wherein said circuit is a software-based circuit.

37. The servomechanism of claim 36 wherein said circuit is comprised of a microprocessor.

38. The servomechanism of claim 32 wherein said status signal represents the angular position of said mechanical component.

39. The servomechanism of claim 32 wherein said status signal represents the angular velocity of said mechanical component.

40. A method for factoring out attenuation of synchro signals in order to obtain a status signal representative of the status of a movable component, said method comprising:

determining respective peak amplitudes of said synchro signals;

comparing said peak amplitudes in order to determine the two highest of said peak amplitudes; and determining said status signal using the two highest of said peak amplitudes.

41. The method of claim 40 wherein said method is performed substantially by a software-based circuit.

42. The method of claim 41 wherein said software-based circuit is comprised of a microprocessor.

* * * * *